PARAMETRIC PRE-AMPLIFIER CIRCUIT FOR CHARGED PARTICLE DETECTORS

Filed Nov. 23, 1966

INVENTORS.
ROBERT L. CHASE
VELJKO RADEKA
BY [signature]
Attorney

PARAMETRIC PRE-AMPLIFIER CIRCUIT FOR CHARGED PARTICLE DETECTORS

Filed Nov. 23, 1966 3 Sheets-Sheet 2

INVENTOR.
ROBERT L. CHASE
VELJKO RADEKA
BY Roland A. Anderson
Attorney

INVENTORS.
ROBERT L. CHASE
BY VELJKO RADEKA
Roland A. Anderson
Attorney

United States Patent Office 3,480,870

Patented Nov. 25, 1969

3,480,870

PARAMETRIC PRE-AMPLIFIER CIRCUIT FOR CHARGED PARTICLE DETECTORS

Robert L. Chase, Blue Point, and Veljko Radeka, Upton, N.Y., assignors to the United States of America as represented by the United States Atomic Energy Commission Filed Nov. 23, 1966, Ser. No. 596,734

Int. Cl. H03f 7/00

U.S. Cl. 330—4.9 5 Claims

ABSTRACT OF THE DISCLOSURE

This invention relates to a parametric pre-amplifier circuit having feedback control means for providing high gain with low noise for use with solid state charged particle detectors. The circuit consists of a tank circuit that is self-resonant at a first frequency; pumping means providing a voltage input to the tank circuit at a second frequency; and feedback control means for tuning the tank circuit, comprising a transformer and an R-F amplifier coupled through a low-pass filter to a video-difference amplifier, in turn coupled via a high impedance network followed by an R-F filter to the charge input to the tank circuit.

This invention was made in the course of, or under a contract with the United States Atomic Energy Commission.

PRIOR ART

Parametric amplifiers generally comprise two types—negative conductance amplifiers and up-converters. In an up-converter, power from a low frequency signal source combines with power at a higher pump frequency for delivery to a load circuit tuned to a still higher frequency equal to the sum of the signal and pump frequencies. With perfect filters, the Manly-Rowe relation predicts a power gain equal to the ratio of output-to-signal frequency. In practice, however, the use of an up-converter with a charge signal from a low capacitance source, such as a solid state particle detector of the type employing lithium-drift compensated germanium, provides relatively little improvement over conventional techniques. These techniques, for example, employ charge-sensitive preamplifiers of the type having vacuum tubes or bipolar and field effect transistors where resolution has generally been limited by amplifier noise. This is largely due to the fact that at high output frequencies, the subsequent transistor or tube amplifier stage represents a high load conductance wherein, even with substantial power gain, very little voltage gain results because of high source impedance at signal frequency.

In the negative conductance parametric amplifier, power from the pump goes to both the input and output circuits and the power flow from the pump to the signal circuit represents a negative conductane in the signal circuit, whose value depends on the pump voltage. By providing negative conductance close to the positive conductance in the signal circuit, very high gain results. However, the heretofore known negative conductance amplifiers have had an inherently narrow relative bandwidth that has prevented their use with solid-state detectors, since the latter have produced signals of a large relative bandwidth. Also, the high gain of these negative conductance amplifiers has varied inversely with the small difference between the large positive conductance and the negative conductance, resulting in poor gain stability.

BRIEF SUMMARY OF THE INVENTION

In accordance with this invention, a standing RF signal is produced as a subharmonic oscillation in a parametric tank circuit and is sustainied and phase-locked by an externally applied signal near twice the tank resonant frequency, which external signal acts, in addition, as a pump for negative conductance amplification. The standing RF signal, in turn, acts as a pump for up-converting the input charge signal. With the proper selection of components and their operation, as described in more detail hereinafter, the desired parametric amplfication is obtained.

It is an object of this invention, therefore, to provide an improved feedback control means for providing high gain with low noise in a parametric amplifier for use with solid state particle detectors;

It is another object to provide a parametric amplifier having upconverter and negative conductance systems combined with a feedback control;

It is another object to stabilize a negative conductance amplifier having a tank circuit in a high gain condition and to maintain a standing RF level in the tank circuit whereby the standing RF acts as a pump for upconverting a charge signal;

It is a further object to provide a standing RF as subharmonic oscillation in a tank circuit sustained and phase locked with an externally supplied signal near twice the tank resonant frequency;

It is a still further object to provide a negative conductance parametric amplifier with high gain for a broad frequency bandwidth of charge signals.

The above and further objects and novel features of the invention will appear more fully from the following detailed description of an embodiment of this invention when the same is read in connection with the accompanying drawings, and the novel features will be particularly pointed out hereinafter in connection with the appended claims. It is to be expressly understood, however, that the drawings are not intended as a definition of the invention but are for purposes of illustration only.

BRIEF DESCRIPTION OF THE SEVERAL VIEWS OF THE DRAWINGS

In the drawings where like elements are referenced alike.

DETAILED DESCRIPTION OF THE INVENTION

This invention is useful in providing high gain amplification over a broad frequency band of charge signals. In one embodiment, this invention is particularly useful as a pre-amplifier for solid-state charged particle detectors where the following noise performance referred to germanium detectors, has been obtained:

| | FW HM | Slope |
|---|---|---|
| Temperature, ° K.: | | |
| 300 | 1.40 kev | 20 ev./pf. |
| 77 | 0.64 kev | 13 ev./pf. |

It will be understood, however, that this invention is useful in any application where high gain, low noise and charge amplification are desired.

Figure 1:
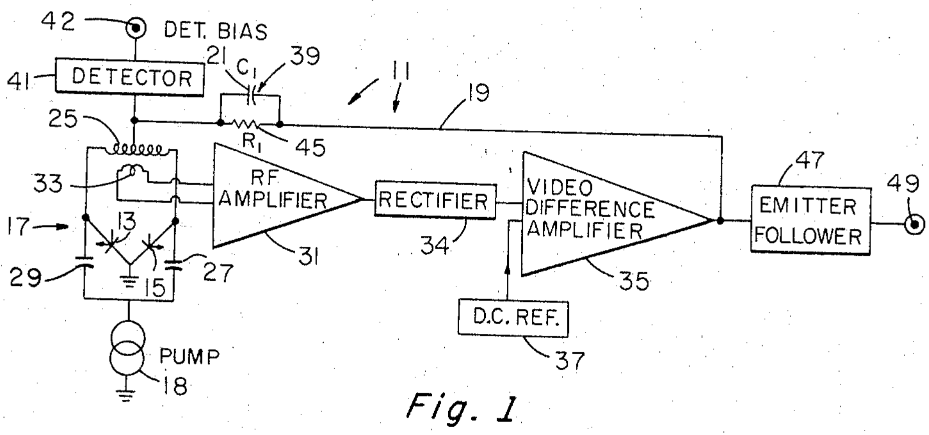
FIGURE 1 is a partial block diagram of the system of this invention.

Referring now to FIGURE 1, in one embodiment, the charge-sensitive amplifier 11 of this invention employs a pair of varactor diodes 13 and 15 in a novel parametric amplifier configuration as the first amplifying element. The circuit, comprises a parametric subharmonic oscillator 17, pumped at about 130 mc. by a suitable pump 18 included with a negative feedback loop 19. Input charge signals perturb the oscillator tuning and the feedback circuit 19 prevents significant change in the oscillator amplitude by supplying an approximately equal, opposite charge to the input circuit through a small feedback capacitor 21.

The tank circuit 17, consisting of inductor 25 in series with varactor diodes 13 and 15 shunted by small 1 pf. pumping capacitors 27 and 29, self-resonates at an angular frequency $\omega_0$. Application of the pump voltage at a frequency $\omega_p$ causes the varactor capacitance to vary at the pump frequency and presents a negative conductance to the tank circuit at a frequency $\omega=\omega_p/2$. In the absence of feedback, the oscillation builds up until limited either by forward conduction in the varactor diodes 13 and 15 or by detuning effects resulting from the nonlinear capacitance-voltage characteristic of the varactors.

In accordance with this invention, feedback loop 19 controls the amplitude. To this end, the oscillating circuit 17 loosely couples to a low noise RF amplifier 31 through pick-up loop 33. A rectifier 34 and DC-coupled differential video amplifier 35 rectifies the RF amplifier output and further amplifies it. An adjustable DC reference 37 compares this rectified output therewith so that the polarity of the DC voltage of the video amplifier depends on whether the rectified RF is greater than or less than the reference. RC network and RF isolating filter 39 feeds back this video amplifier output to the oscillating parametric circuit 17. The feedback voltage alters the varactor capacitance, changing the tuning of tank circuit 17. A low oscillation level causes the feedback to tune the circuit 17 closer to $\omega_p/2$ so that the level tends to build up. At high levels, the detuning increases so that the circuit 17 quickly arrives at an equilibrium level dictated by the DC reference 37, the gain of amplifier 31 and the effective transformation ratio between the inductance of tank circuit 17 and the pickup loop 33. This maintains a stable low level oscillation relatively independent of small variations in amplitude of pump 18 and parameters of the described circuit.

The charge that collects on the capacitance of detector 41, which has a suitable bias 42, quickly shares among the varactors 13 and 15, the small pump capacitors 27 and 29, the feedback capacitor 21 and other strays. The change in voltage on the varactors 13 and 15 alters their average capacitance and disturbs the equilibrium tuning condition of tank 17. Depending on the polarity of the signal charge from detector 41, the oscillation amplitude selectively tends either to increase or decrease respectively. The change in the RF level produces a voltage change at the video amplifier output, which feeds back to the varactors via capacitor 21 as a charge opposite in polarity to the signal charge from detector 41. At high gain, the feedback loop 19 produces a new equilibrium in which the charge on capacitor 21 almost exactly equals the detector charge, analogously to the heretofore known charge-sensitive amplifiers. Subsequently, the charge on capacitor 21 leaks off through resistor 45 to establish the original equilibrium. Thus the charge on detector 41 appears greatly amplified at the output provided by the emitter follower 47 and a suitable read-out 49.

Figure 2:
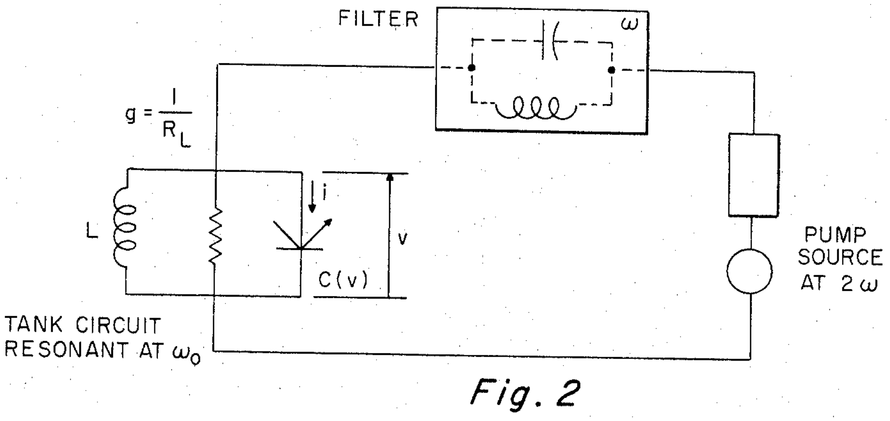
FIGURE 2 is a partial schematic diagram illustrating principles involved in this invention.
Figure 3:
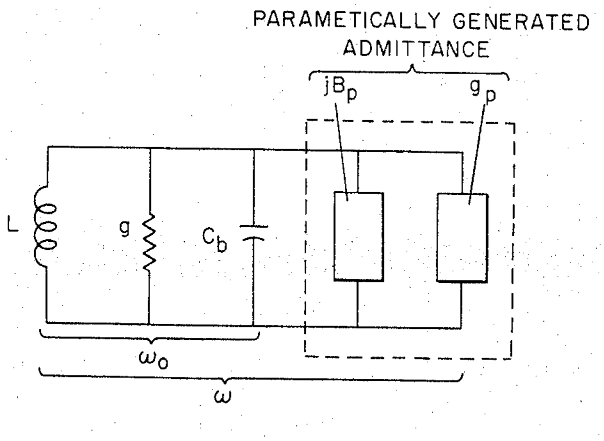
FIGURE 3 is a partial schematic diagram illustrating further principles involved in this invention.

In understanding this invention, reference is made to FIGURES 2 and 3, which illustrate the basic circuits of a parametric subharmonic oscillator, comprising an L-C-$g$ tank circuit with a time variable and with a voltage dependent reactive parameter and pump source. The voltage dependent reactive parameter used in this case, comprises the capacitance of a reverse-biased P-N junction (i.e. the varactor diode). The filter separates the tank circuit from the pump source at the frequency of oscillation $\omega$. The first order time behaviour of the parametric oscillator depends on analysis of stationary quantities, under the assumption of a slow variation in time of the oscillation amplitude compared to the oscillation frequency $\omega$. The "first order" assumes that varactor capacitance varies linearly with voltage.

The pumping at $2\omega$ creates—under proper phase relation with respect to the voltage at $\omega$—negative conductance across the tank circuit through parametric action of the voltage dependent varactor capacitance. More generally, under arbitrary phase relations an admittance is created. This admittance can be determined from the relation of the varactor current and voltage. The current through the varactor capacitance can be found as, $$i=C(v)\frac{dv}{dt} \quad \text{(A1)}$$

The voltage on the varactor capacitance is the sum of the oscillation voltage and the pump voltage, $$v=A\sin(\omega t+\theta)+V_p\sin 2\omega t \quad \text{(A2)}$$

Capacitance of the varactor diode as a function of voltage is given by $$C=C_o\left(1-\frac{V}{\phi}\right)^{-1/n} \quad \text{(A3)}$$

where $\phi$ is the diffusion potential, V—terminal voltage, $n$—number dependent on the junction profile ($n=2$ for abrupt junction, $n$—3 for graded junction). Expanding the above expression in a Taylor series at the bias point $V=V_b=(V_b'-\phi)$ one obtains for the first three terms, $$C=C_b\left[1+\frac{1}{n}\frac{v}{V_b'}+\frac{1}{2}\frac{1}{n}\left(\frac{1}{n}+1\right)\frac{v^2}{V_b'}\right] \quad \text{(A4)}$$

where $C_b$ is the varactor capacitance at the bias point, $V_b'=V_b+\phi$ and $V_b$ is terminal bias.

Taking the constant first term and the linear second term (which is the essential one for parametric action) and using Equations A1 and A2, the current through the varactor capacitance is calculated. Neglecting the terms of high frequencies $3\omega$ and $4\omega$ (which are unimportant as they do not produce any significant voltages) the currents at $\omega$ and $2\omega$ are respectively, $$i_\omega=\omega C_bA\cos(\omega t+\theta)-\frac{1}{2n}\omega C_b\frac{A\cdot V_p}{V_b}\sin(\omega t-\theta) \quad \text{(A5)}$$

$$i_{2\omega}=2\omega C_bV_p\cos 2\omega t+\frac{1}{2n}\omega C_b\frac{A^2}{V_b}\sin(2\omega t+2\theta). \quad \text{(A6)}$$

The first term in both expressions represents the reactive current through the constant term of the varactor capacitance at frequencies $\omega$ and $2\omega$. The second term in $i_\omega$ represents the current at $\omega$ due to parametric pumping at $2_\omega$. The second term in $i_{2\omega}$ represents the loading of the pump source at $2\omega$ by the voltage at $\omega$.

The admittance generated at $\omega$ in parallel with the varactor due to the parametric action is determined as the ratio of the current at $\omega$ to the voltage at $\omega$. Using vector representation it follows that, $$y=\frac{-\frac{1}{2n}\omega C_b\frac{A\cdot V_p}{V'_b}\underline{/-\theta}}{A\underline{/\theta}}$$

$$=-\frac{1}{2n}\omega C_b\frac{V_p}{V'_b}\underline{/-2\theta} \quad (A7)$$

Defining the relative capacitance variation due to pumping in terms of the pump voltage as $$\Gamma=\frac{1}{2}\frac{\Delta C}{C}=\frac{1}{2n}\frac{V_p}{V'_b} \quad (A8)$$

it then follows for the admittance, $$y=-\omega C_b\cdot\Gamma\underline{/-2\theta} \quad (A9)$$

The real part represents the "parametric" conductance $$g_p=-\omega C_b\cdot\Gamma\cdot\cos 2\theta \quad (A10)$$

and the imaginary part the "parametric" susceptance $$B_p=\omega C_b\cdot\Gamma\cdot\sin 2\theta \quad (A11)$$

Considering these expressions with respect to the phase between A and $V_P$ it can be concluded that:

(a) For $$-\frac{\pi}{4}<\theta<\frac{\pi}{4}$$

the conductance $g_p$ is negative, i.e., there is a flow of real power from the pump source to the tank circuit.

(b) For $$\frac{\pi}{4}<\theta<\frac{\pi}{2} \text{ and } -\frac{\pi}{2}<\theta<-\frac{\pi}{4}$$

the conductance $g_p$ is positive, i.e., real power flows from the tank circuit to the pump source.

(c) For $\theta=\pm\pi/4$, there is no interchange of real power.

(d) For all angles except $\theta=0$, $\theta=\pm\pi/2$, there is an interchange of reactive power.

All the results hold for $\theta+\pi$, i.e., for a voltage A opposite in phase. For an arbitary phase angle $\theta$, the "parametric" susceptance can be tuned out so that the total susceptance of the tank circuit equals zero. Then the detuning in terms of the relative difference between the resonant frequency of the unpumped tank $$\omega_0=\frac{1}{(LC_b)1/2}$$

and the frequency $\omega$ can be defined as $$\alpha=2\frac{\omega-\omega_0}{\omega_0}=-\frac{B_p}{\omega C_b}=-\Gamma\sin 2\theta \quad (A12)$$

Substituting $\theta$ from this expression into (A10), the negative conductance as a function of the pump amplitude and detuning becomes $$g_p=-\omega C_b(\Gamma^2-\alpha^2)^{1/2} \quad (A13)$$

Having thus defined the parameters of the parametric oscillator, the time behavior can be determined from the linear analysis of an L-C-$g$ tank circuit. As is well well known, the envelope of oscillation amplitudes of an L-C-$g$ tank circuit is given by $$A=A_0\exp.(st) \quad (A14)$$

where $s$ is equal to one half the ratio of the total conductance and capacitance, $$s=-\frac{\Sigma(g)}{2C} \quad (A15)$$

Using the relation (A13) for $g_p$, and defining the loss factor as $$\delta=\frac{g}{\omega Cb} \quad (A16)$$

it follows for the exponent, $$s=-\frac{g_p+g}{2C_b}=\frac{\omega}{2}[(\Gamma^2-\alpha^2)^{1/2}-\delta] \quad (A17)$$

which is the basis for stability eq.

$$S=\frac{\omega}{2}[(\Gamma^2-\alpha^2)^{1/2}-\delta]=0$$

The time behavior and the phase relations of a detuned parametric oscillator can thus be summarized as follows. In equilibrium for $s=0$, the negative conductance generated by parametric pumping compensates for the losses. The susceptance generated by pumping tunes the tank circuit to the frequency of oscillation. The phase angle of oscillation $\theta$ is related to detuning-to-loss factor ratio by the expression $$\tan 2\theta=-\frac{\alpha}{\delta}$$

which can be obtained using Eqs. A10, A12, A16 and the equilibrium condition $g_p+g=0$. For pumping above the resonant frequency of the tank ($\omega>\omega_0$), detuning is positive, the susceptance generated is negative (inductive), so that $\theta<0$ and the oscillation lags the pump voltage $V_p$. If this equilibrium is perturbed by a change in any of the three quantities $\Gamma$, $\alpha$, $\delta$, the oscillation amplitude grows or decays according to the sign of the exponent factor $s$.

The high gain of the parametric amplifier of this invention is utilized to make the noise contribution by the subsequent RF amplifier 47 insignificant. Analysis shows that the gain required with respect to the noise of the subsequent RF amplifier is about 100 or more. For ease of explanation, the gain limiting mechanisms are described as detuning feedback. Accordingly, the pump feedback of this invention compensates for this detuning feedback by equalizing the magnitude and sign thereof.

Figure 4:
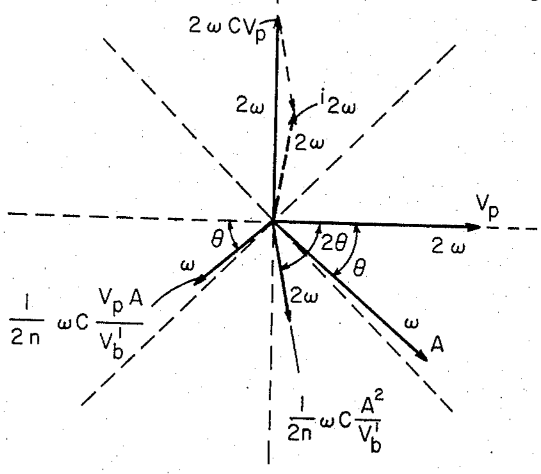
FIGURE 4 is a partial schematic diagram of still further principles involved in this invention.

In understanding these detuning and compensating feedbacks, it is noted that the polarity of both feedback factors is determined by the sign of detuning, i.e. whether the parametric circuit is pumped below or above resonance. The sign of the pump feedback depends as well on the phase angle of the pump source impedance. If we consider, as an example, pumping above resonance ($\omega_p>2\omega_0$), it can be shown that a positive signal charge at the input increases the varactor capacitance, which increases the detuning and decreases the oscillation amplitude. This, in turn, decreases the average capacitance and therefore the detuning, so that the dominant detuning feedback is negative. Thus, the sign of the pump feedback should be positive to compensate for the detuning feedback. This sign can be derived from the phase relations of currents and voltages at the pump frequency. The vector diagram constructed for the case of a large ratio $\alpha/\delta$ from voltage and current relations (A2), (A5) and (A6) is presented in FIGURE 4.

As the pump loading current due to oscillation increases with oscillation amplitude, the total current at $\omega_p=2\omega$ decreases. In order to make that feedback positive, the pump voltage should increase with oscillation amplitude, which will take place if the pump source impedance including varactor diodes 13 and 15 is capacitive. The sign of both feedback factors is reversed for pumping below resonance, $\omega_p<2\omega_0$.

A detailed examination of the mentioned feedback factors, indicates that, for compensation of the detuning feedback, the capacitive reactance of the pump source, including varactor diodes 13 and 15, should be about 8 times the reactance of these two varactor diodes in parallel. This is accompanied by tuning the pump source to the required capacitive reactance as described in more detail hereinafter since a low loss pump source impedance must be essentially reactive. A gain of 100 or more has actually been obtained without this adjustment being critical.

Figure 5:
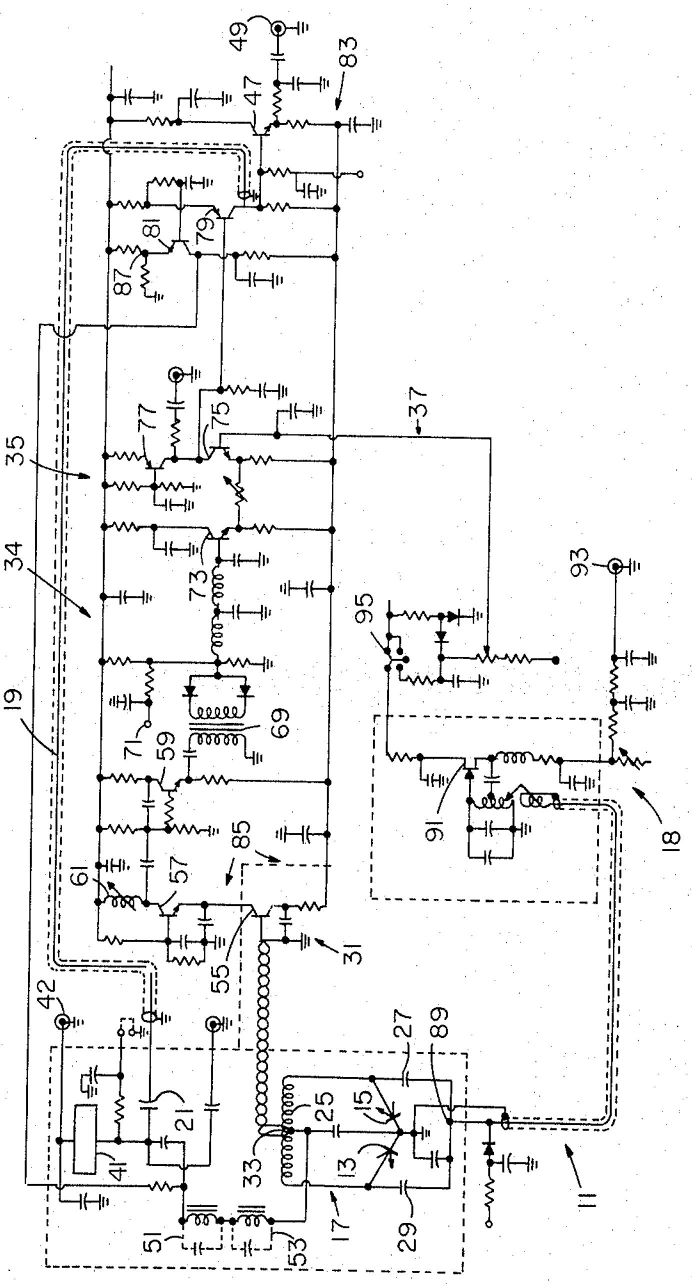
FIGURE 5 is a partial circuit diagram of an embodiment of this invention.

Referring to FIGURE 5 in a practical embodiment of this invention, the parametric tank inductor 25 has 12 turns of silver plated copper wire, ½ inch in diameter wound 16 turns to the inch with polystyrene strips for support and with a Q of about 650 at 65 mc. as measured on a Boonton type 250A RX meter. Pickup loop 33 has a single turn of somewhat smaller diameter polytetrafluoroethylene insulated wire inserted part way into the middle of the main coil 25 and cemented in place to reduce microphonic response. At about 65 mc., initial adjustment provides a 25:1 voltage step down ratio between the full primary 25 and the pickup loop 33.

The varactor diodes 13 and 15 have equal zero bias capacitance within about 5%, low leakage current, less than 1 na. at 1.5 volts reverse at room temperature, and series resistance less than 0.5 ohm.

The isolating chokes 51 and 53 connect to the center tap of the tank coil 25 and have small ferrite toroid cores wound with #34 wire, the number of turns making choke 51 self-resonant at pump frequency and the choke 53 self-resonant at one half the pump frequency, as measured on the RX meter.

The RF amplifier comprises a tuned cascade stage having 2N917 transistors 55 and 57, followed by an emitter follower transistor 59 of the same type. The tuning coil 61 has 7 turns of #30 wire close-spaced on a ferrite slug-tuned ¼ inch core adjusted for maximum gain at the parametric oscillator frequency of about 65 mc.

The untuned full wave detector 34, which follows the RF stage provided by transistors 55 and 57, is driven by a transformer 69 wound with an 8-turn #30 wire primary and 16-turn #30 wire center-tapped secondary on a ferrite toroid. When properly tuned the amplifier detector combination gives a 500 mv. output at the monitor test point 71 when the input base is driven with a 0.2 volt RMS signal at 65 mc.

A low pass filter and video difference amplifier, comprising 2N706 transistors 73 and 75, 2N976 transistors 77 and 79 and 2N414 transistor 81, have an AC gain adjustable from about 2 to 50 and a substantially higher DC gain. The AC gain is adjusted to the highest value that will permit stable operation of the entire feedback loop 19. The value depending on the detector capacitance which, in association with a 0.5 pf. feedback capacitor 21, acts as a voltage divider in the feedback path 19. High values of detector capacitance permit the use of high video amplifier gain to compensate for the voltage divider action in the feedback path 19 and to preserve a reasonable value of reserve loop gain. The high DC gain serves to stabilize the varactor circuit operating conditions so that the compensation adjustments are not adversely affected by high rates and input displacement currents resulting from microphonic sensitivity due to cryostatic operation.

The voltage of bias 37 fed to the base of transistor 75 determines the level of the standing oscillation in the parametric circuit under equilibrium conditions. The optimum adjustment depends on the gain of the RF amplifier 31 and the input coupling, found by adjusting for maximum signal-to-noise ratio, is about −500 mv. at test point 71.

The preamplifier output signal is coupled via a 2N706 emitter follower transistor 47 and an RC integrating circuit 83 to the main amplifier 31, which has RC integrating and differentiating circuits 85 of its own. The additional integration compensates for the fact that the parametric amplifier 11 does not effectively remove the high frequency portion of the noise spectrum generated in subsequent stages.

In operation the compensation adjustment for the above-mentioned detuning feedback, serves to maximize the parametric amplifier gain by adjusting the pump source impedance so that an increase in effective pump voltage with oscillation level compensates for the associated detuning. Treating the two parametric diodes 13 and 15 as effectively in parallel relative to the pump frequency voltage, then the net impedance, at pump frequency, at the diode terminals is the resultant of the parallel combination of: (1) the capacitance of the diodes 13 and 15, (2) the capacitance of the two pumping capacitors 27 and 29 and (3) the leakage inductance of tank coil 25 in series with the compensating capacitor 21.

Compensation is achieved by tuning the combination to parallel resonance, at a frequency slightly less than pump frequency so that, at pump frequency, it represents a net capacitive reactance of up to about 8 times that of the parametric diodes. This compensation adjustment is easily made by introducing a 20 kc. sinusoidal signal at a suitable point late in the amplifier such as point 87, and adjusting the compensation to minimize the resultant output signal. As one passes through the proper compensation adjustment, the phase of the residual sine wave is seen to swing by almsot 180° with respect to the injected signal, the minimum amplitude occurring with the signals in phase quadrature as observed on an oscilloscope triggered by the injected signal.

Since the pump voltage at the varactors is a function of the compensation adjustment and since the detuning is a function of pump amplitude, the compensation and detuning adjustments are not independent. Best performance is usually obtained when the pump voltage is adjusted to the largest value at which a proper compensation adjustment can be made. A good operating pump voltage produces a DC voltage at the pump monitoring test point between 0 and 0.1 volt.

The pump source has good amplitude stability and very low amplitude modulation noise. It is adjustable over a range of at least 20 mc. in the neighborhood of 130 mc. to accomodate various varactors and supplies between 0.25 and 1.5 volts RMS at the pump input terminal 89. The oscillator shown in FIGURE 5, employs a 2N3823 field effect transistor 91 and has sufficiently low noise if operated near its optimum value of source current. Feedback to the stabilizing input 93 from an automatic gain stabilizer compenastes for drift in the oscillator and elsewhere in the system and makes possible long runs even at high gamma ray energies into detector 41.

In order to get the circuit 11 into its normal operating mode when it is first turned on, start push button 95 momentarily raises the reference voltage input to the video amplifier and then allows it to decay slowly to its proper value. This forces the feedback voltage to its positive extreme from which it is allowed to decay to its equilibrium value. Also, it is advantageous to turn off the pump oscillator momentarily while the start push-button 95 is depressed.

Advantageously, the preamplifier has two parts, with the parametric section 17 in an evacuated cooled enclosure. Also, RF shielding around this enclosure and the interconnecting wiring to the RF stage 31 excludes television signals and other high frequency disturbances. Rigid mounts for the parametric section 17 minimize microphonism. Operation of the compensating capacitor 21 by an air trimmer having O-ring sealed shaft through a vacuum wall permits adjustment when the parametric circuit 17 is at a low temperature. Polytetrafluoroethylene insulated connectors and glass insulated resistors for detector load and feedback minimize excess noise, electrical leakage and dielectric losses.

Actual test results indicate good noise performance with integration and differentiation time constants in the range $\tau$=2–5 $\mu$sec. The RMS noise at room temperature is low. At 90° K the RMS noise charge was 95 electrons +2 electrons/pf., FWHM(Ge)=0.64 kev.+0.013 kev./pf. At lower temperatures such as at liquid nitrogen temperature, the parametric circuit 17 has decreasing noise characteristics, it being noted that these figures are much better than the 6–8 RMS electrons per pf. for conventional low noise amplifiers.

Figure 6:
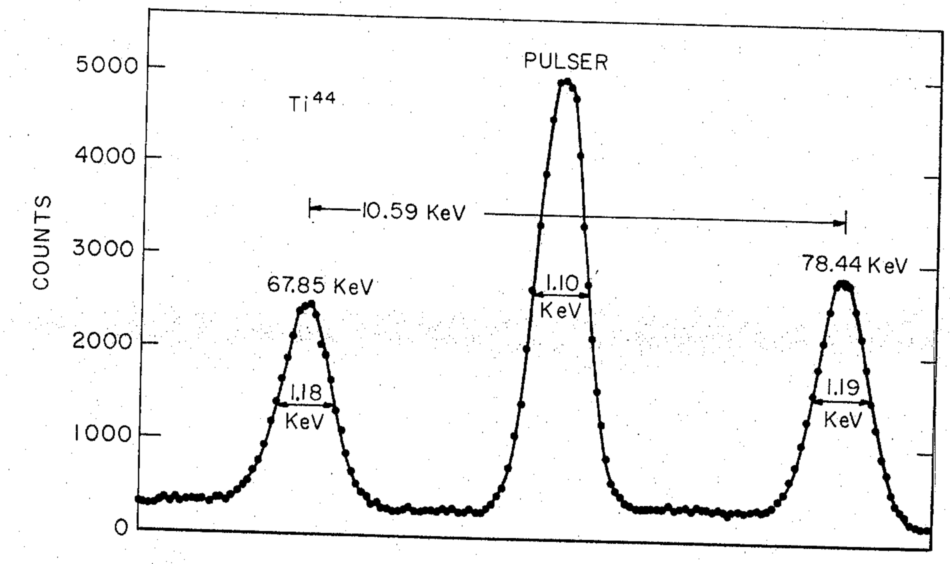
FIGURE 6 is a graphic illustration of signal detected from a broad energy range of particles in accordance with this invention.

Good gamma-ray energy resolution has been obtained with a high quality Ge detector 41. For example, FIGURE 6 shows a gamma ray line width of approximately 1.2 kev. and the pulser line width of 1.1 kev. is essentially the same as that obtained when the detector was replaced by an equivalent capacitor.

This invention has the advantage of providing a low noise parametric amplifier system for a broad band of charge signals. The system of this invention is particularly advantageous for use with solid state charged particle detectors, particularly large volume germanium detectors, since it amplifies a broad band of charge signals therefrom with less noise than the amplifiers known heretofore. Additionally, the feedback system of this invention provides a stable parametric pre-amplifier with advantages of both the negative conductance and up-converter parametric amplifiers known heretofore.

What is claimed is:

1. A pre-amplifier for charge signals from a solid state charged particle detector, comprising (a) a parametric subharmonic oscillator having a tank circuit and pumping means for producing an alternating oscillation signal whose amplitude can be modified by said input charge signals for providing for low noise amplification thereof, and (b) operational amplifier feedback control means for controlling the amplitude of oscillation in said tank circuit for maintaining said oscillator in a stable oscillating condition in the presence and absence of said input charge signals to said oscillator, and whose output is a measure of said input charge signals to said oscillator for providing said low noise amplification of said charge signals with relatively high gain over a relatively broad band of frequencies.

2. The invention of claim 1, wherein said tank circuit incorporates varactor diodes in a self-resonating circuit pumped by said pumping means at a frequency slightly different from twice the resonant frequency of said self-resonating circuit, and said feedback control means has an RF amplifier, rectifier, video difference amplifier, and RC network arranged in series for feeding a negative feedback signal from said tank circuit to said varactor diodes for providing for said maintaining of said oscillator in said stable oscillating condition while the output of said video difference amplifier in said feedback control means is a measure of the input of said charge signals to said oscillator.

3. The invention of claim 1 in which said tank circuit has in series an inductor and non-linear capacitor means having shunting capacitors therefor, whereby the application of a voltage at a first frequency from said pumping means to said tank circuit causes the capacitance of said non-linear variable capacitor means to vary at the frequency of said pumping means and to present a negative conductance in said tank circuit at a second frequency, and whereby, in the absence of feedback from said feedback control means, an oscillation in said tank circuit builds up as limited by forward conduction in said non-linear variable capacitor means and detuning effects resulting from the non-linear capacitance-voltage characteristics of said non-linear variable capacitor means, and said feedback control means responds to said charge signals to provide a negative feedback having a controlled amount of positive feedback for reducing negative feedback within the oscillator itself for compensating for the non-linearity of said non-linear variable capacitor means.

4. The invention of claim 1 in which the parametric subharmonic oscillator has parallel non-linear varactor diodes, and the feedback control means tunes the capacitive reactance of the pumping means to about eight times the reactance of the varactor diodes for compensating for the detuning of said oscillator resulting from the non-linearity of said varactor diodes for providing for said low noise, high gain, broad frequency band amplification of said charge signals from said solid state charge particle detector.

5. The invention of claim 1 in which said tank circuit consists of an inductor coupled in series between two reverse-biased varactor diodes coupled to ground and a pair of capacitors between said varactor diodes and a pumping terminal, said tank circuit being self-resonant at a first angular frequency, said inductor having a center tap and said tap coupled through a variable capacitor to ground;

said pumping means for providing a voltage input to said pumping terminal at a second angular frequency about twice said first angular frequency, said pumping means comprising a substantially noise-free and stable oscillator with one terminal coupled to ground;

said means for feedback control of the amplitude of oscillation in said tank circuit comprising a transformer coupling said inductor to a low-noise radio-frequency amplifier tuned for maximum gain at said first frequency, the output of said radio-frequency amplifier transformer coupled to an untuned full-wave detector which is coupled, as a first input, through a low-pass filter to a direct-current coupled video difference-amplifier of adjustable gain having, as a second input, an adjustable direct current reference potential, the output terminal of said video difference-amplifier coupled to said center tap via a high impedance resistor-capacitor network followed by a radio-frequency isolating filter for both said first frequency and for said second frequency, said output terminal providing the output coupling point from said pre-amplifier; and having input means for coupling one of said radiation detectors to said means for feedback control at a point between said resistor-capacitor network and said radio-frequency isolating filter;

switch means, associated with said adjustable direct-current reference potential and with said pumping means, for assuring start-up of the said pre-amplifier in its normal operating mode;

means for radio-frequency shielding of said tank circuit and interconnecting wiring to said radio-frequency amplifier;

and, means for evacuating and cooling to about the temperature of liquid nitrogen the volume occupied by the said tank circuit.

References Cited

UNITED STATES PATENTS 3,388,263 6/1968 Daniel -------------- 330—4.9

ROY LAKE, Primary Examiner

LAWRENCE J. DAHL, Assistant Examiner

U.S. Cl. X.R.

307—320